(12) United States Patent
Chang et al.

(10) Patent No.: US 7,835,192 B2
(45) Date of Patent: Nov. 16, 2010

(54) METHOD FOR PROGRAMMING A NONVOLATILE MEMORY

(75) Inventors: Ting-Chang Chang, Kaohsiung (TW); Shih-Ching Chen, Xinzhuang (TW); Fu-Yen Jian, Kaohsiung County (TW)

(73) Assignee: Acer Incorporated, Taipei Hsien (TW)

( * ) Notice: Subject to any disclaimer, the term of this patent is extended or adjusted under 35 U.S.C. 154(b) by 28 days.

(21) Appl. No.: 12/314,129

(22) Filed: Dec. 4, 2008

(65) Prior Publication Data
US 2010/0034027 A1 Feb. 11, 2010

(30) Foreign Application Priority Data
Jul. 8, 2008 (TW) .............................. 97125647 A

(51) Int. Cl.
*G11C 16/04* (2006.01)
(52) U.S. Cl. ............................ 365/185.28; 365/185.18; 365/185.26
(58) Field of Classification Search ............ 365/185.28, 365/185.33, 185.26, 185.18
See application file for complete search history.

(56) References Cited

U.S. PATENT DOCUMENTS

| 5,258,949 | A | 11/1993 | Chang et al. |
| 5,742,541 | A | 4/1998 | Tanigami et al. |
| 6,005,809 | A | 12/1999 | Sung et al. |
| 6,282,123 | B1 * | 8/2001 | Mehta .................... 365/185.28 |
| 6,307,781 | B1 | 10/2001 | Shum |
| 7,031,196 | B2 | 4/2006 | Yeh et al. |
| 2003/0081460 | A1 | 5/2003 | Choi et al. |
| 2005/0162922 | A1 | 7/2005 | Hsu et al. |
| 2005/0270849 | A1 | 12/2005 | Lue |
| 2006/0033146 | A1 | 2/2006 | Wang |
| 2007/0196982 | A1 | 8/2007 | Eitan |
| 2009/0109762 | A1 * | 4/2009 | Huang et al. ............ 365/185.28 |

OTHER PUBLICATIONS

European Search Report for Application No. 08170425.6-1233/2144250 mailed Jul. 5, 2010.

* cited by examiner

*Primary Examiner*—Anh Phung
*Assistant Examiner*—Hien N Nguyen
(74) *Attorney, Agent, or Firm*—Stites & Harbison PLLC; Juan Carlos A. Marquez, Esq.

(57) ABSTRACT

A method for programming a nonvolatile memory includes applying at least a voltage to a source or a drain, so as to inject carriers of the source or drain into a substrate; applying a third voltage to a gate or the substrate, so that the carriers which are in the substrate having enough energy can surmount an oxide layer to reach a charge storage device.

12 Claims, 5 Drawing Sheets

METHOD FOR PROGRAMMING A NONVOLATILE MEMORY

CROSS REFERENCE TO RELATED APPLICATIONS

This application claims the right of priority based on Taiwan Patent Application No. 097125647 entitled "METHOD FOR PROGRAMMING A NONVOLATILE MEMORY", filed on Jul. 8, 2008, which is incorporated herein by reference and assigned to the assignee herein.

FIELD OF THE INVENTION

The present invention is related to a method for programming a nonvolatile memory, especially to a method for programming a nonvolatile memory to reduce the voltage, time, and power for writing a memory.

BACKGROUND OF THE INVENTION

The nonvolatile memory can retain the stored information even when power off and also can be rewrote the information several times when power is on. Due to the physical limitation of the nonvolatile memory, the thickness of the tunneling oxide layer will be decreased when the dimension of the device is decreased. The tunneling oxide layer also undergoes several times of fast read/write process. Once the leakage path of the tunneling oxide layer is created, the charges stored in the floating gate will be released away and the information will be erased. In one aspect, the data retention of the memory will be degraded, when the device has the thinner oxide layer. In another aspect, the writing speed of the charge gets slow when the thickness of the oxide layer is increased to improve the storage ability. Therefore, there is a compromise between the speed, reliability, and the data retention of the memory device.

There are two ways of the conventional method for programming the nonvolatile memory: one is Fowler-Nordheim tunneling program process, and the other is the channel-hot-electron (CHE) program process. The CHE program process writes in data faster but consumes more energy when several cells are programmed at the same time. The energy consumption of the FN (Fowler-Nordheim) tunneling program process is less and several cells can be programmed at the same time, but the voltage of program is larger and the speed of program is slower. To increase the speed and decrease the voltage of the FN tunneling program process, the thickness of the tunneling oxide layer needs to be decreased and the data retention of the memory will be decreased.

Therefore, there is a need to provide a method for programming a nonvolatile memory to resolve the above-mentioned problem.

SUMMARY OF THE INVENTION

The invention provides a method for programming a nonvolatile memory where the nonvolatile memory has a source, a drain, a charge storage device, a gate, a bottom oxide layer disposed between the substrate and charge storage device, and a top oxide layer disposed between the charge storage device and the gate. The method comprising the steps of: applying at least a voltage to the source or the drain to inject a carriers of the source or the drain into the substrate; and applying a third voltage to the gate or the substrate, to energize the carrier of the substrate enough energy to overcome the barrier of the oxide layer to reach the charge storage device.

The objective and features of the invention will be apparent from the description of accompanying the drawings of the invention.

DETAILED DESCRIPTION OF THE INVENTION

The present invention discloses a method for programming a nonvolatile memory. As discussed above, the advantage of the FN tunneling program process is fewer power consumption, but the advantage of the CHE program process is higher writing speed. The present invention combines the advantages of the FN tunneling program and the CHE program to form a novel method for programming a nonvolatile memory. In the following the present invention can be further understood by referring to the exemplary, but not limiting, description accompanied with the drawings in FIG. 1 to FIG. 4B.

Figure 1A:
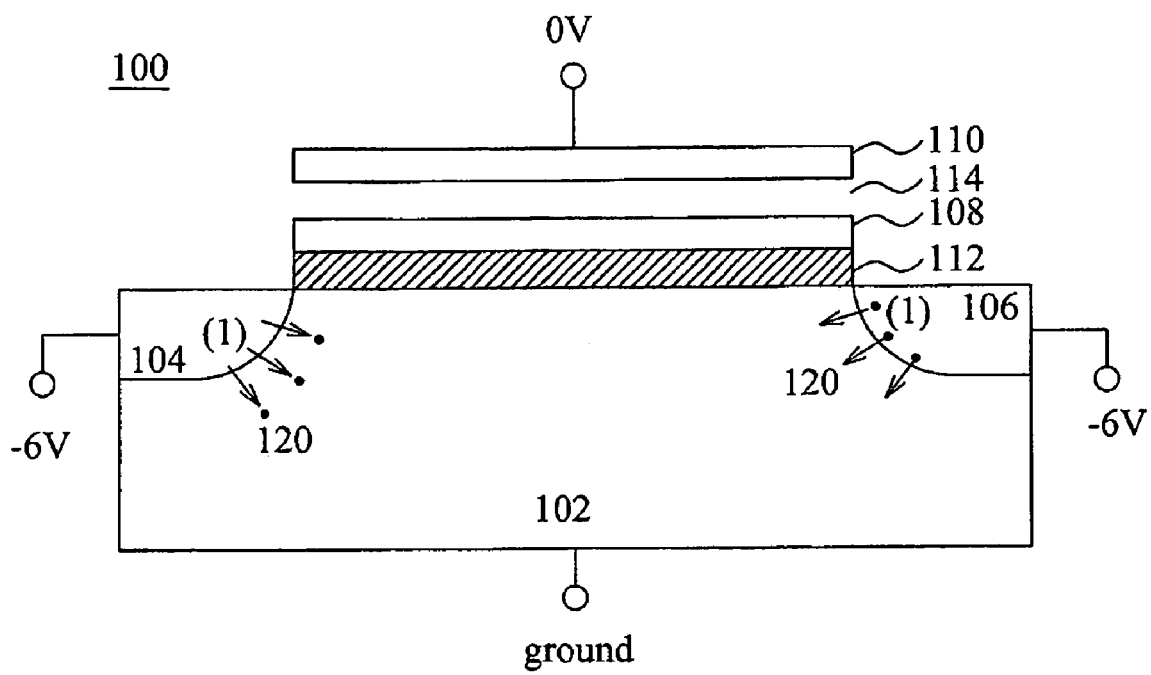
FIGS. 1A and 1B illustrate a method for programming a nonvolatile memory in accordance with one embodiment of present invention.
Figure 1B:
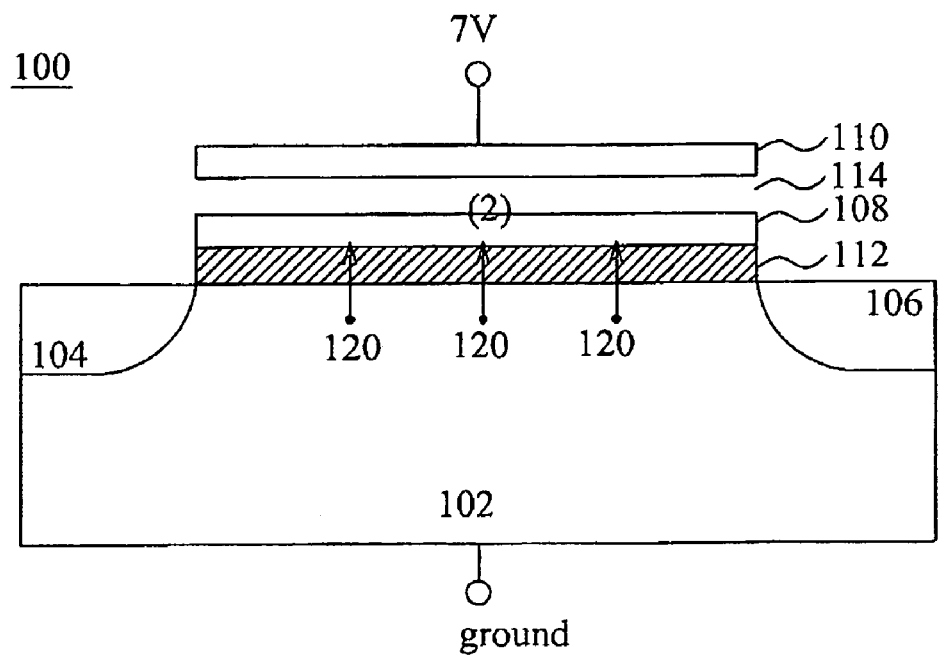

FIGS. 1A and 1B are schematic diagrams showing a method for programming a nonvolatile memory 100, also referred to the method for programming substrate hot carrier, in accordance with one embodiment of present invention. The voltage, the writing time, and the power consumption of programming a nonvolatile memory 100 can be reduced by using the method for programming the substrate hot carrier. The method for programming the substrate hot carrier is less related to the thickness of the oxide layer 112. Therefore, the thicker oxide layer 112 can be used in the nonvolatile memory, such that the writing efficiency and the data retention of the nonvolatile memory 100 can be obtained at the same time.

The n-type nonvolatile memory 100 includes a source 104, a drain 106, and a charge storage device 108, a bottom oxide layer 112, a top oxide layer 114, and a gate 110. The source 104, the drain 106, and the charge storage device 108 are separately disposed on a p-type substrate 102. The bottom oxide layer 112 is placed between the substrate 102 and charge storage device 108. The top oxide layer 114 is placed between the charge storage device 108 and the gate 110. It should be noted that the charge storage device 108 can be a floating gate or charge trapping layer, and therefore the nonvolatile memory can be floating gate device or charge trapping device.

Referring to FIGS. 1A and 1B, the method for programming the substrate hot carriers combines the advantages of the FN tunneling program progress and the CHE program progress by using the carriers 120 (hot carriers) of the substrate 102 in the method of programming the nonvolatile memory 100. In one embodiment, the method for programming the nonvolatile memory 100 by the substrate hot carriers programming method includes the following steps: (1) a source voltage of -6 volts is applied to the source 104 (i.e. a forward biased voltage is applied to the source 104), and a drain voltage of -6 volts is applied to the drain 106 (i.e. a forward biased voltage is applied on the drain 106), and a gate voltage of 0 volt is applied to gate 110, so that the carriers 120 are injected from the source 104 and the drain 106 into the substrate 102, as shown in FIG. 1A. (2) The gate voltage of 7 volts is applied to the gate 110 and the substrate 102 is grounded, so the substrate 102 is immediately in deep depletion state, and a larger electrical field is generated to increase the speed of carriers 120 (means electrons in this embodiment). It should be noted that the gate also can be grounded and the substrate 102 also can be applied with a voltage of -7 volt (not shown). Therefore, the carriers 120 of the substrate 102 are speeded up by the electrical field to obtain enough energy and overcome the energy barrier (not shown) of a bottom oxide layer 112, thereby reaching the charge storage device 108, as shown in FIG. 1B.

Figure 2A:
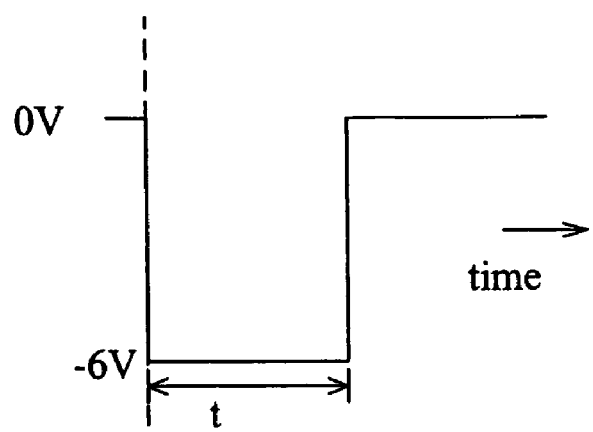
FIG. 2A is a voltage-time diagram of the source/drain in accordance with one embodiment of present invention.

FIG. 2A is a voltage-time diagram of the voltage of the source 104/drain 106 in accordance with one embodiment of present invention. The voltage of the source 104 and the drain 106 is a negative pulse voltage. The source voltage and the drain voltage are both set as -6 volts for a time period of t.

Figure 2B:
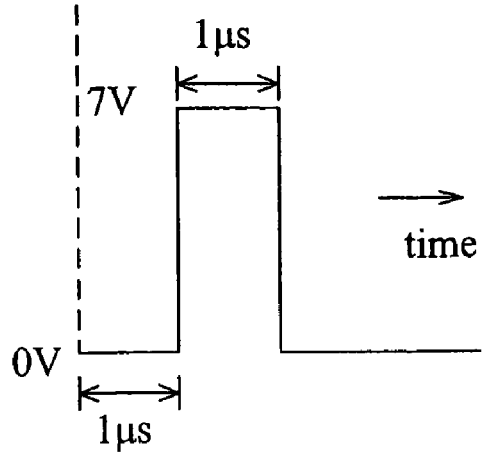
FIG. 2B is a voltage-time diagram of the gate in accordance with one embodiment of present invention.

FIG. 2B is a voltage-time diagram of the gate in accordance with one embodiment of present invention. In step (2), the voltage applied to the gate 110 is a positive pulse voltage. In the present embodiment, the gate 110 is set as 0 volt for a time period of 1 μs until the carriers 120 (i.e. electrons) of the source 104 and the drain 106 are injected to the substrate 102. Then the gate voltage is set as -7 volts for a time period of 1 μs to speed up the carriers 120. The carriers 120 overcome the energy barrier of the bottom oxide layer 112 and reach the charge storage device 108, and the programming progress is completed.

Figure 3A:
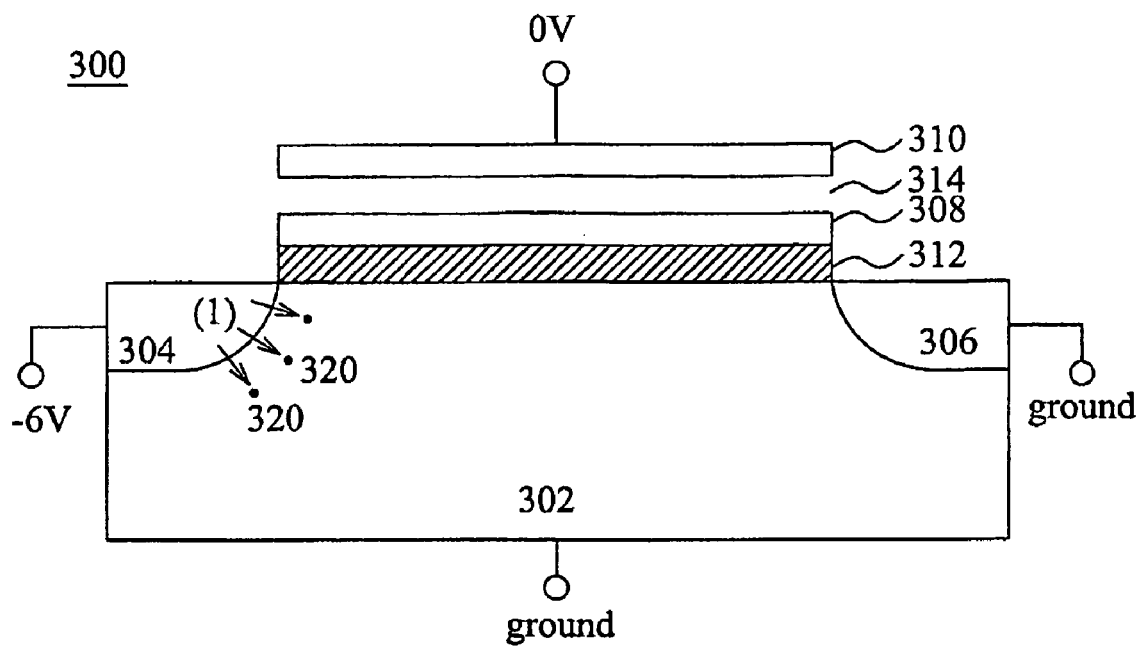
FIGS. 3A and 3B illustrate a method for programming a nonvolatile memory in accordance with one embodiment of present invention.
Figure 3B:
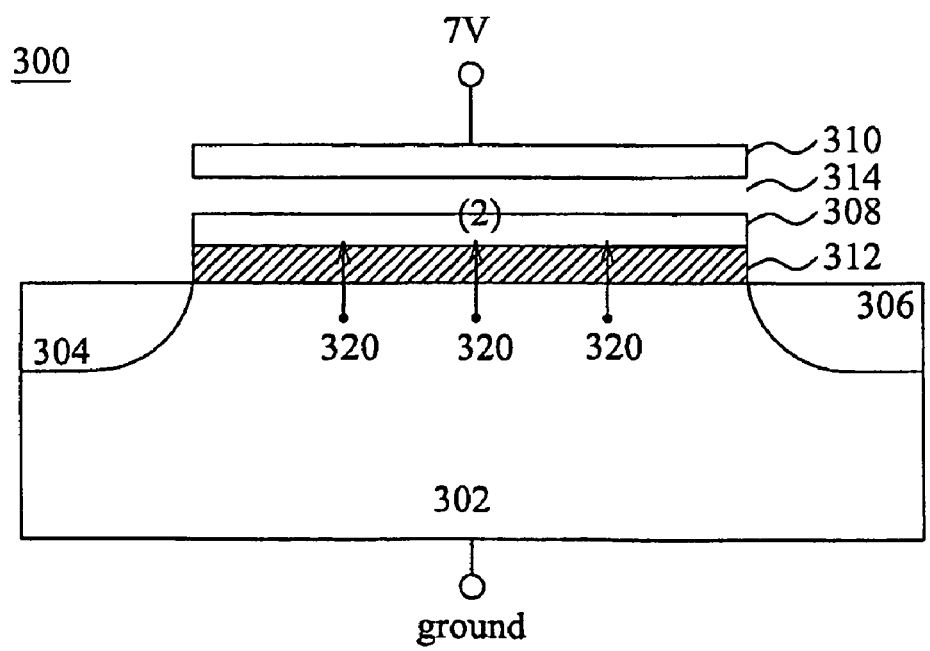
Figure 4A:
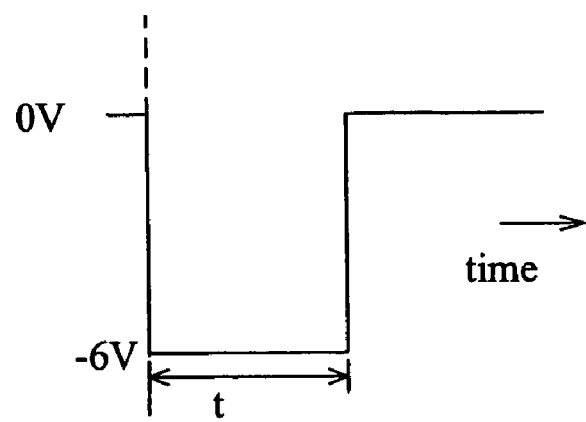
FIG. 4A is a voltage-time diagram of the source/drain in accordance with another embodiment of present invention.

In another embodiment, FIGS. 3A and 3B illustrate a method for programming a nonvolatile memory 300 in accordance with one embodiment of the present invention. The nonvolatile memory 300 includes a source 304, a drain 306, and a charge storage device 308, a bottom oxide layer 312, a top oxide layer 314, and a gate 310. The bottom oxide layer 312 is placed between the substrate 302 and charge storage device 308. The top oxide layer 314 is placed between the charge storage device 308 and the gate 310. The method for programming the nonvolatile memory 300 by the substrate hot carriers programming method includes the following steps: (1) a source voltage of -6 volts is applied to the source 304 (i.e. a forward biased voltage is applied on the source 304), and a drain 306 is grounded, and a gate voltage of 0 volt is applied to the gate 310, so that the carriers 320 are injected from the source 304 into the substrate 302, as shown in FIG. 3A. FIG. 4A is a voltage-time diagram of the source 304 in accordance with another embodiment of present invention. In this step, the source voltage applied to the source is a negative pulse voltage. It should be noted that the drain 306 is grounded. (2) The gate voltage of 7 volts is applied to the gate 310 and the substrate 302 is grounded or floated, so the substrate 302 is immediately in deep depletion state, and a larger electrical field is generated to increase the speed of carriers 320 (means electrons in this embodiment). It should be noted that the gate also can be grounded and the substrate 302 also can be applied a voltage of -7 volt (not shown). Therefore, the carriers 320 of the substrate 302 are speeded by the electrical field to obtain enough energy, and the energy barrier of the bottom oxide layer 312 is overcome by the carriers 320 (not shown), whereby the carriers 320 can reach the charge storage device 308, as shown in FIG. 3B.

Figure 4B:
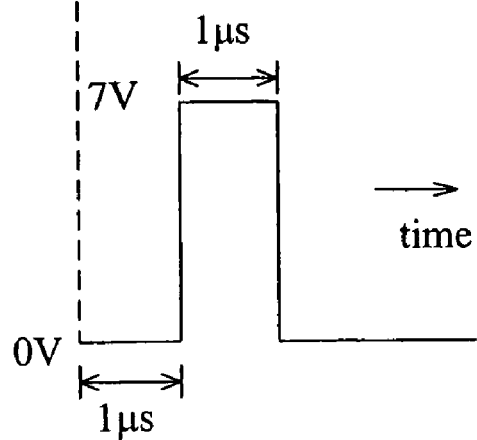
FIG. 4B is a voltage-time diagram of the gate in accordance with another embodiment of present invention.

FIG. 4B is a voltage-time diagram of the voltage of the gate in accordance with one embodiment of present invention. In step (2), the voltage applied to the gate 310 is 0 volt for the time period of 1μs until the carriers 320 (i.e. electrons) of the source 304 is injected to the substrate 302. Then the gate voltage is set as 7 volts for a time period of 1μs to speed up the carriers 320. The carriers 320 reach the charge storage device 308, and the programming progress is completed.

Figure 3C:
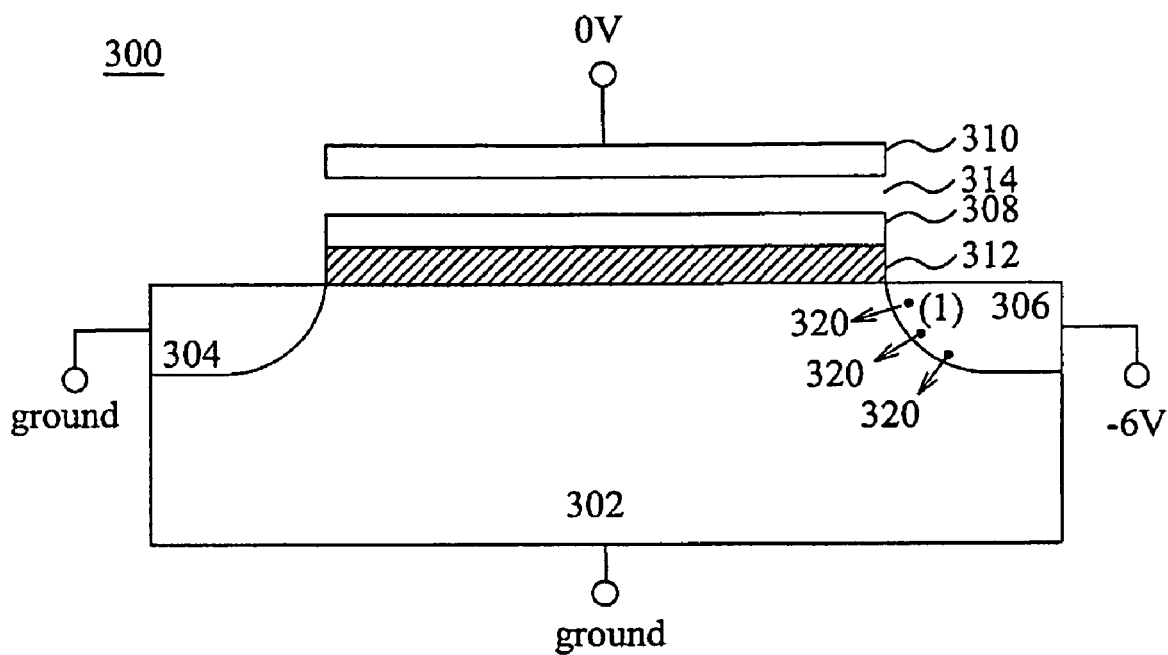
FIGS. 3C and 3D illustrate a method for programming a nonvolatile memory in accordance with another embodiment of present invention.
Figure 3D:
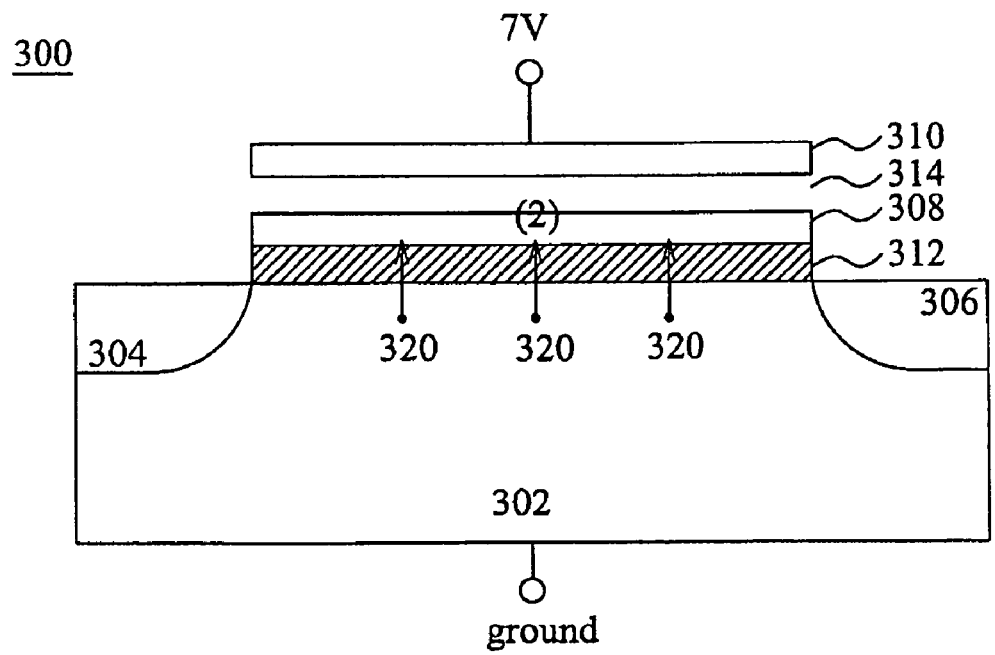

FIGS. 3C and 3D illustrate a method for programming a nonvolatile memory in accordance with another embodiment of present invention. In this embodiment, the step (2) shown in FIG. 3D is the same as the step (2) of the last embodiment shown in FIG. 3B. The step (1) shown in FIG. 3C includes: applying a drain voltage of -6 volts to the drain 306 (i.e. applying a forward biased voltage to the drain 306), and grounding the source, such that the carriers 320 are injected from the drain 306 into the substrate 302.

Although the specific embodiments of the present invention have been illustrated and described, it is to be understood that the invention is not limited to those embodiments. One skilled in the art may make various modifications without departing from the scope or spirit of the invention.

What is claimed is:

1. A method for programming a nonvolatile memory, the nonvolatile memory having a substrate with a source and a drain, a charge storage device, a gate, a bottom oxide layer disposed between the substrate and charge storage device, and a top oxide layer disposed between the charge storage device and the gate, the method comprising the steps of:
    applying a forward biased voltage to at least one of the source and the drain while grounding the substrate, such that at least one of carriers of the source and the drain is injected into the substrate; and
    applying a gate voltage to the gate while applying a substrate voltage to the substrate in order to make the substrate get into a deep depletion state, such that the carrier of the substrate is able to overcome the barrier of the bottom oxide layer to reach the charge storage device.

2. The method for programming a nonvolatile memory according to claim 1, wherein the step of applying the forward biased voltage to at least one of the source and the drain while grounding the substrate further comprises:
    applying the forward biased voltage to both the source and the drain while grounding the substrate, such that the carriers of the source and the drain are injected into the substrate.

3. The method for programming a nonvolatile memory according to claim 1, wherein the step of applying the forward biased voltage to at least one of the source and the drain while grounding the substrate further comprises:
    applying the forward biased voltage to the source and grounding the drain while grounding the substrate, such that the carrier of the source is injected into the substrate.

4. The method for programming a nonvolatile memory according to claim 1, wherein the step of applying the forward biased voltage to at least one of the source and the drain while grounding the substrate further comprises:
    applying the forward biased voltage to the drain and grounding the source while grounding the substrate, such that the carrier of the drain is injected into the substrate.

5. The method for programming a nonvolatile memory according to claim 1, wherein the gate voltage is a positive pulse voltage, and the substrate voltage is a ground voltage.

6. The method for programming a nonvolatile memory according to claim 5, wherein the positive pulse voltage is held at a logic low level for about 1 microsecond, and then switched to a logic high level for about 1 microsecond.

7. The method for programming a nonvolatile memory according to claim 6, wherein the logic low level is 0 volt and the logic high level is about 7 volt.

8. The method for programming a nonvolatile memory according to claim 1, wherein the gate voltage is a ground voltage, and the substrate voltage is a negative voltage.

9. The method for programming a nonvolatile memory according to claim 1, wherein the carrier is an electron or a hole.

10. The method for programming a nonvolatile memory according to claim 1, wherein the nonvolatile memory is n-type, and the forward biased voltage being applied to at least one of the source and the drain is a negative biased voltage.

11. The method for programming a nonvolatile memory according to claim 1, wherein the charge storage device is a floating gate or a charge trapping layer.

12. The method for programming a nonvolatile memory according to claim 1, wherein the nonvolatile memory is p-type, and the forward biased voltage being applied to at least one of the source and the drain is a positive biased voltage.

* * * * *